(12) United States Patent
Peng

(10) Patent No.: US 7,312,614 B2
(45) Date of Patent: Dec. 25, 2007

(54) COMMUTATOR FOR POWER SUPPLY TESTING

(75) Inventor: Min Peng, Shenzhen (CN)

(73) Assignees: Hong Fu Jin Precision Indusrty (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,278

(22) Filed: Jul. 21, 2006

(65) Prior Publication Data

US 2007/0108983 A1 May 17, 2007

(30) Foreign Application Priority Data

Oct. 21, 2005 (CN) .................. 2005 2 0066218

(51) Int. Cl.
*G01R 31/04* (2006.01)
*G01R 31/36* (2006.01)
*G01R 11/32* (2006.01)
*G06F 11/00* (2006.01)

(52) U.S. Cl. .................. 324/538; 324/771; 324/134; 713/340

(58) Field of Classification Search ............... 324/538, 324/537, 500, 66, 771, 76.11, 134; 702/60, 702/122; 713/300, 340
See application file for complete search history.

(56) References Cited

U.S. PATENT DOCUMENTS

| 5,353,240 | A | * | 10/1994 | Mallory et al. ............. 702/186 |
| 5,576,941 | A | * | 11/1996 | Nguyen et al. .......... 363/21.07 |
| 6,771,052 | B2 | * | 8/2004 | Ostojic ....................... 323/266 |
| 6,827,589 | B2 | * | 12/2004 | Lin et al. .................... 439/76.1 |
| 7,081,719 | B2 | * | 7/2006 | Chang et al. ............... 315/247 |
| 2004/0189341 | A1 | * | 9/2004 | Liu .............................. 324/771 |
| 2006/0026420 | A1 | * | 2/2006 | Babb et al. ................. 713/150 |
| 2006/0153361 | A1 | * | 7/2006 | Chen ....................... 379/413.01 |

* cited by examiner

*Primary Examiner*—Vincent Q. Nguyen
*Assistant Examiner*—Hoai-An D. Nguyen
(74) *Attorney, Agent, or Firm*—Wei Te Chung

(57) ABSTRACT

A commutator for power supply testing includes a printed circuit board (PCB), a plurality of connectors soldered on the PCB and coupling a power supply with an electronic load, a plurality of indicator light showing whether the power supply coupled to the commutator is working, and a switch circuit. The connectors are used to couple a power supply with an electronic load. The switch circuit controls a flow of current from the power supply to the electronic load.

15 Claims, 1 Drawing Sheet

COMMUTATOR FOR POWER SUPPLY TESTING

FIELD OF THE INVENTION

The present invention relates to a commutator for power supply testing.

DESCRIPTION OF RELATED ART

A typical microprocessor-cored computer system, such as a personal computer or a workstation computer, is turned on and off by a switch device that mechanically connects/disconnects a power supply of the computer system to/from an external voltage source, such as AC 110V. The power supply is connected to the external voltage source and transforms the external voltage into a predetermined DC level, such as +/−5V and +/−12V, and the computer system is turned on to perform various programs and functions.

As known by a person skilled with computers, the power supply mainly includes ATX power supply and BTX power supply. A motherboard of a computer can be coupled with the ATX power supply via a 20-pin ATX power connector and two 4-pin ATX power connectors. The 20-pin ATX power connector is coupled electrically with devices and a CPU socket on the motherboard through circuits thereon. One of the 4-pin ATX power connector, with four pins configured in-line, is applied to provide individual +12V/ground/ground/+5V power. Another 4-pin ATX power connector, with four pins configured in a square pattern, is applied to provide individual +12VB/ground/+12VB/ground power. The motherboard also can be coupled with the BTX power supply with a 24-pin BTX power connector, a 6-pin BTX power connector, and a 4-pin BTX power connector. The 24-pin BTX power connector is coupled electrically with devices and a CPU socket on the motherboard through circuits thereon. The 6-pin BTX power connector is applied to provide individual +12VA/ground/+12VA/ground/+12VA/ground power. The 4-pin BTX power connector, with four pins configured in a square pattern, is applied to provide individual +12VA/ground/+12VA/ground power.

However, an ATX or BTX power supply must be tested by an electronic load before being installed in a computer. Chroma programmable DC electronic load 6310 series system is suitable for testing and evaluation of multi-output AC/DC power supplies, AC/DC converters, chargers, and power electronic components and is also applicable in areas such as research and development, production, and incoming inspection. The system is configured by plugging the user selectable load modules into the system mainframe, and operated using a keypad on the front panel of the system or with remote controlled instructions via an RS-232C or GPIB interface.

The 6310 series offers 8 types of modular loads with power ranging from 30 watts to 1200 watts, current ranging from 0.5 mA to 240 mA, and voltage measurement from 0.5 mV to 500 V. Each load is isolated and floating, programmable in dual current range and measuring voltage range, and capable of synchronizing with other modules for control operation. The load can be operated as with a constant current source or a constant voltage source, with constant resistance.

What is needed is a commutator for coupling a computer power supply with an electronic load in power supply testing.

SUMMARY OF THE INVENTION

A commutator for computer power supply testing includes a printed circuit board (PCB), a plurality of connectors soldered on the PCB, a plurality of indicator lights showing whether a power supply coupled to the commutator is working, and a switch circuit. The connectors are used to couple the power supply with an electronic load. The switch circuit controls whether the current from the power supply is flowing to the electronic load.

It is simple and economical to using the commutator for coupling the power supply with the electronic load in the computer power supply testing process.

Other advantages and novel features will become more apparent from the following detailed description when taken in conjunction with the accompanying drawings, in which:

DETAILED DESCRIPTION OF THE INVENTION

Figure 1:
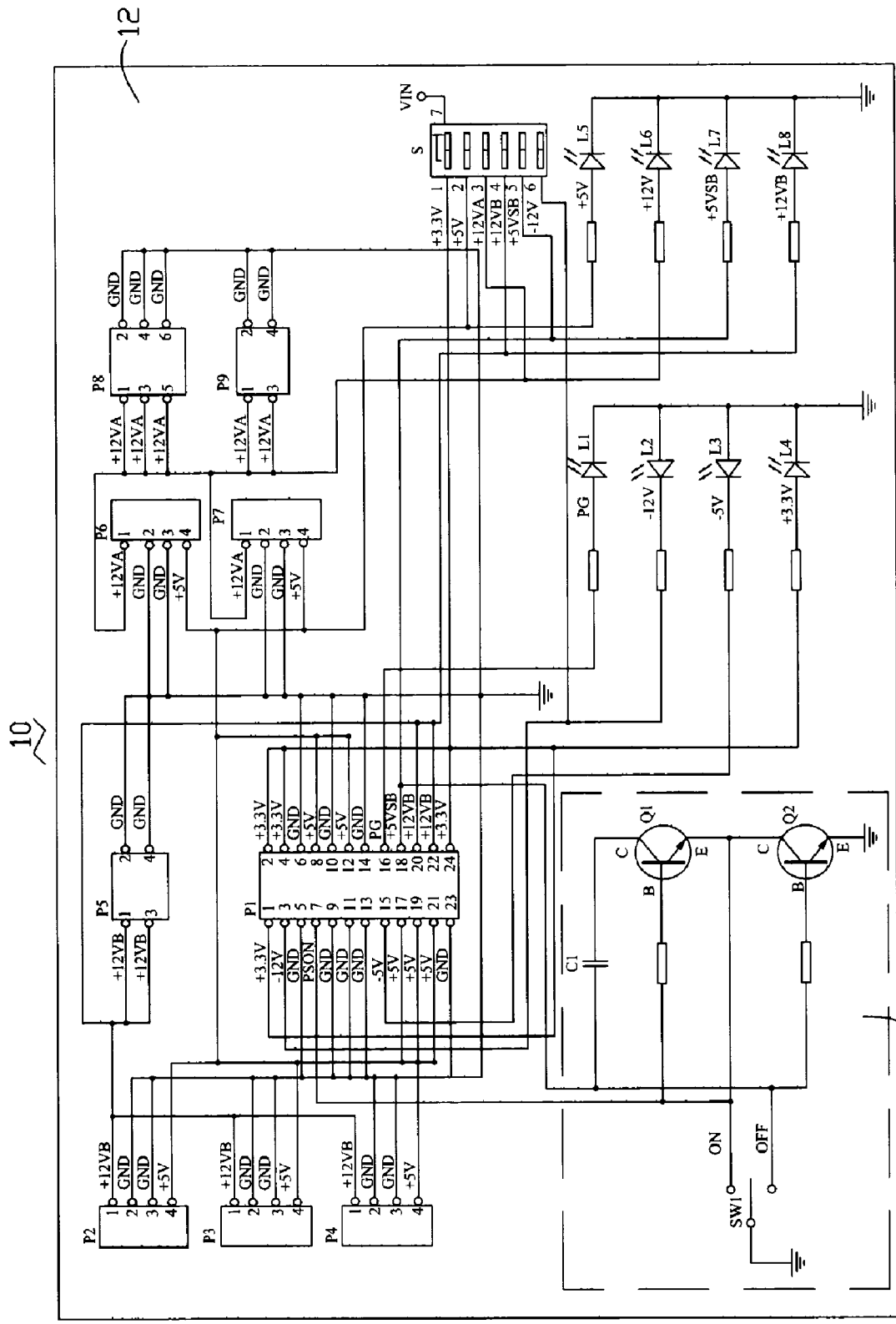
FIG. 1 is a schematic diagram of one embodiment of a commutator for testing a power supply in accordance with the present invention.

Referring to FIG. 1, a commutator 10 Includes a PCB 12, a plurality of connectors P1~P9 soldered on the PCB 12, a plurality of indicator lights L1~L8 showing whether a power supply coupled to the commutator 10 is working, and a switch circuit 14. The PCB 12 further includes a switch S and a power input port VIN.

The connector P1 is a 24-pin BTX power connector which is applied to provide individual +3.3V/+3.3V/−12V/+3.3V/ground/ground/PSON/+5V/ground/ground/ground/+5V/ground/ground/−5V/PG/+5V/+5VSB/+5V/+12VB/+5V/+12VB/ground/+3.3V power. The connectors P2, P3, and P4 are 4-pin ATX power connectors with four pins configured in-line. The connector P5 is a 4-pin ATX CPU power connectors with four pins configured in a square pattern. The connectors P6 and P7 are 4-pin BTX power connectors with four pins configured in-line. The connectors P6 and P7 are used to provide individual +12VA/ground/ground/+5V power. The connector P8 is a 6-pin BTX power connector. The connector P9 is a 4-pin BTX power connector with four pins configured in a square pattern. Each pin of the connectors P1~P9 is connected to a corresponding interface of an electronic load via a signal line.

The switch circuit 14 includes a changeover switch SW1 and two transistors Q1 and Q2. A port on a side of the changeover switch SW1 is connected to ground. ON and OFF ports on another side of the changeover switch SW1 are connected to the corresponding pins PSON and +5VSB of the connector P1 respectively. A base of the transistor Q1 is connected to the ON port of the changeover switch SW1. A collector of the transistor Q1 is connected to the OFF port of the changeover switch SW1 via a capacitor C1. An emitter of the transistor Q1 is connected to the ON port of the changeover switch SW1. A base of the transistor Q2 is connected to the OFF port of the changeover switch SW1. A collector of the transistor Q2 is connected to the ON port of the changeover switch SW1. An emitter of the transistor Q2 is connected to ground.

The indicator lights L1~L8 are light-emitting diodes (LEDs). Anodes of the indicator lights L1, L4, L5, L6, L7, and L8 are connected to corresponding pins PG, +3.3V, +5V, +12VA, +5VSB, and +12VB of the connectors P1~P9 respectively, and cathodes of the indicator lights L1, L4, L5, L6, L7, and L8 are connected to ground. Cathodes of the indicator lights L2 and L3 are connected to corresponding pins −12V and −5V respectively, and anodes of the indicator lights L2 and L3 are connected to ground.

The switch S is a multi-way switch. A user may select any one of the +3.3V, +5V, +12VA, +12VB, +5VSB, and −12V voltages by the switch S. Ports 1~6 of a side of the switch S are connected to the pins +3.3V, +5V, +12VA, +12VB, +5VSB, and −12V of the connector P1~P9 respectively. Port 7 of the switch S is connected to the power input port VIN. Voltage of the power input port VIN is compared with every voltage of the ports 1~6. If the voltage of power input port VIN is greater than the voltage selected by the switch S, the power supply is automatically turnoff.

When the commutator 10 is used to test ATX power, the changeover switch SW1 is turned to the ON port, the indicator lights L1~L5, L7, and L8 light up. And the electronic load automatically tests the ATX power supply coupled to the commutator 10. When the commutator 10 is used to test BTX power, the changeover switch SW1 is turned to the ON port, the indicator lights L1~L8 light up. And the electronic load automatically tests the BTX power supply coupled to the commutator 10. The indicator lights L1~L8 indicate the PG, +3.3V, +5V, +12VA, +5VSB, and +12VB are working when lit.

It is to be understood, however, that even though numerous characteristics and advantages of the present embodiments have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A commutator for computer power supply testing, comprising:
   a printed circuit board (PCB);
   a plurality of connectors soldered on the PCB and coupling a power supply with an electronic load;
   a plurality of indicator lights showing whether the power supply coupled to the commutator by the connectors is working; and
   a switch circuit controlling a flow of current from the power supply to the electronic load,
   wherein the connectors include at least one 24-pin BTX power connector, three 4-pin ATX power connectors, one 4-pin ATX CPU power connector, two 4-pin BTX power connectors, and one 6-pin BTX power connector.

2. The commutator as claimed in claim 1, wherein the PCB includes a multi-way switch and a power input port coupled to the connectors via the multi-way switch.

3. The commutator as claimed in claim 1, wherein the switch circuit includes a changeover switch with a port connecting to ground and ON and OFF ports connecting to corresponding pins PSON and +5VSB of the connectors respectively.

4. The commutator as claimed in claim 3, wherein the switch circuit further includes two transistors.

5. The commutator as claimed in claim 4, wherein a base, a collector, and an emitter of one of the transistors are connected to the ON port of the changeover switch, the OFF port of the changeover switch, and the ON port of the changeover switch respectively, and a base, a collector, and an emitter of the other one of the transistors are connected to the OFF port of the changeover switch, the ON port of the changeover switch, and ground respectively.

6. The commutator as claimed in claim 1, wherein the indicator lights are light-emitting diodes.

7. A commutator for computer power supply testing, comprising:
   a printed circuit board (PCB);
   a plurality of ATX power connectors, a plurality of BTX power connectors, and a 24-pin power connector soldered on the PCB and selectively coupling an ATX power supply or a BTX power supply with an electronic load;
   a plurality of indicator lights showing whether the power supply coupled to the commutator by the connectors is working; and
   a switch circuit controlling a flow of current from the power supply to the electronic load,
   wherein the switch circuit includes a changeover switch with a port connecting to ground and ON and OFF ports connecting to corresponding pins PSON and +5VSB of the 24-pin power connector respectively.

8. The commutator as claimed in claim 7, wherein the switch circuit further includes two transistors, a base, a collector, and an emitter of one of the transistors are connected to the ON port of the changeover switch, the OFF port of the changeover switch, and the ON port of the changeover switch respectively, and a base, a collector, and an emitter of the other one of the transistors are connected to the OFF port of the changeover switch, the ON port of the changeover switch, and ground respectively.

9. The commutator as claimed in claim 7, wherein the indicator lights are light-emitting diodes.

10. The commutator as claimed in claim 7, wherein the PCB includes a multi-way switch and a power input port coupled to the connectors via the multi-way switch.

11. The commutator as claimed in claim 7, wherein the ATX power connectors include three 4-pin ATX power connectors, and one 4-pin ATX CPU power connector, and the BTX power connectors include two 4-pin BTX power connectors, and one 6-pin BTX power connector.

12. A commutator for computer power supply testing, comprising:
   a printed circuit board (PCB);
   a plurality of connectors soldered on the PCB and coupling a power supply with an electronic load;
   a plurality of indicator lights showing whether the power supply coupled to the commutator by the connectors is working; and
   a switch circuit controlling a flow of current from the power supply to the electronic load,
   wherein the switch circuit includes a changeover switch with a port connecting to ground and ON and OFF ports connecting to corresponding pins PSON and +5VSB of the connectors respectively, the switch circuit further includes two transistors, a base, a collector, and an emitter of one of the transistors are connected to the ON port of the changeover switch, the OFF port of the changeover switch, and the ON port of the changeover switch respectively, and a base, a collector, and an emitter of the other one of the transistors are connected to the OFF port of the changeover switch, the ON port of the changeover switch, and ground respectively.

13. The commutator as claimed in claim 12, wherein the connectors include at least one 24-pin BTX power connector three 4-pin ATX power connectors, one 4-pin ATX CPU power connector, two 4-pin BTX power connectors, and one 6-pin BTX power connector.

14. The commutator as claimed in claim 12, wherein the indicator lights are light-emitting diodes.

15. The commutator as claimed in claim 12, wherein the PCB includes a multi-way switch and a power input port coupled to the connectors via the multi-way switch.

* * * * *